United States Patent
Allen

[11] Patent Number: 5,903,057
[45] Date of Patent: May 11, 1999

[54] SEMICONDUCTOR DEVICE THAT COMPENSATES FOR PACKAGE INDUCED DELAY

[75] Inventor: Michael J. Allen, Rescue, Calif.

[73] Assignee: Intel Corporation, Santa Clara, Calif.

[21] Appl. No.: 08/966,213

[22] Filed: Nov. 7, 1997

[51] Int. Cl.⁶ .......................... H01L 23/48; H01L 23/52; H01L 29/40
[52] U.S. Cl. .......................................... 257/776; 257/786
[58] Field of Search .................................. 257/666, 776, 257/786

[56] References Cited

U.S. PATENT DOCUMENTS

| | | | |
|---|---|---|---|
| 5,229,846 | 7/1993 | Kozuka | 257/666 |
| 5,394,008 | 2/1995 | Ito et al. | 257/666 |
| 5,399,904 | 3/1995 | Konzo | 257/666 |
| 5,400,218 | 3/1995 | Val | 257/666 |
| 5,646,830 | 7/1997 | Nagano | 257/666 |

*Primary Examiner*—Valencia Martin-Wallace
*Assistant Examiner*—S. V. Clark
*Attorney, Agent, or Firm*—Kenyon & Kenyon

[57] ABSTRACT

A semiconductor device includes a first and second pin, a first lead finger coupled to the first pin and a second lead finger coupled to the second pin, and a die coupled to the lead fingers. The die includes a first die pad coupled to the first lead finger and a second die pad coupled to the second lead finger. The die further includes a first output driver coupled to the first die pad and a second output driver coupled to the second die pad. The first output driver is coupled to the first die pad via an extended metal trace. The extended metal trace compensates for differences in electrical length between the first lead finger and the second lead finger.

12 Claims, 2 Drawing Sheets

SEMICONDUCTOR DEVICE THAT COMPENSATES FOR PACKAGE INDUCED DELAY

FIELD OF THE INVENTION

The present invention is directed to a semiconductor device. More particularly, the present invention is directed to a semiconductor device that compensates for package induced delay.

BACKGROUND OF THE INVENTION

A typical circuit board includes multiple semiconductor and other electronic devices. For most of the signals traveling between these devices, timing considerations are increasingly important as the speeds of the devices are increased. For example, with a 16-bit data bus between two or more devices, the signal on each line of the bus should arrive at a receiving device at approximately the same time to avoid timing problems with the device. At higher speeds, this becomes more difficult to control.

Semiconductor devices typically include internal timing delay mismatches due to package constraints. For example, referring now in detail to the drawings, wherein like parts are designated by like reference numerals throughout, FIG. 1 is a plan view illustrating a simplified prior art semiconductor device 50. Semiconductor device 50 includes a semiconductor die 40 embedded in a package 10. Package 10 includes a plurality of pins or balls 12–15 that couple semiconductor device 50 to a circuit board. The signals output from pins 12–15 form a single group (e.g., a data bus).

Pins 12–15 are coupled to die 40 via lead fingers 20–23, respectively. In a typical package such as package 10, the lengths of lead fingers 20–23 vary among different pins due to, for example, the position of pins 12–15 and the route each lead finger 20–23 must take from die 40 to pins 12–15 (e.g., a lead finger may have to weave around other pins or traverse several layers in package 10). The disparity in length between lead fingers can sometimes be over one inch.

Die 40 includes a plurality of output drivers 30–33 corresponding to each pin 12–15. Die 40 further includes a plurality of die pads 34–37 for each output driver 30–33. Output drivers 30–33 are coupled to die pads 34–37 via a metal trace (e.g., metal trace 42), which is referred to as a "standard metal trace" for the purpose of this patent. The length of the standard metal traces are typically the shortest distance between their corresponding die pad and output driver. Die pads 34–37 are coupled to lead fingers 20–23 via a bond wire (e.g., bond wire 44) or directly coupled using known methods.

In most advanced semiconductor devices, die 40 is designed or tuned so that the group of output signals measured at pads 34–37 are matched to within 10 picoseconds ("ps") of each other (i.e., all of the signals arrive at pads 34–37 within a 10 ps window). Adjustments to die 40 to achieve this matching level typically occur within die 40 below output drivers 30–33.

However, when die 40 is placed in package 10, the signals must travel through lead fingers 20–23 before exiting device 50 onto a circuit board. The differing lengths of lead fingers 20–23 add differing propagation delays to the signals when the signals arrive at pins 12–15. For example, if lead finger 20 is one inch longer than lead finger 22, an additional 200 ps of timing delay may be added to the signal traveling on lead finger 20 compared to the signal traveling on lead finger 22. Therefore, because of the disparity between the lengths of lead fingers 20–23, the group of signals are no longer matched within 10 ps when they arrive at pins 12–15. This timing mismatch must then be compensated for in the circuit board, which adds to the complexity of designing the circuit board.

Based on the foregoing, there is a need for a semiconductor device in which the timing of a group of the output signals is matched at the pins.

SUMMARY OF THE INVENTION

One embodiment of the present invention is a semiconductor device that includes a die pad, an extended metal trace coupled to the die pad, and an output driver coupled to the extended metal trace.

DETAILED DESCRIPTION

Figure 2:
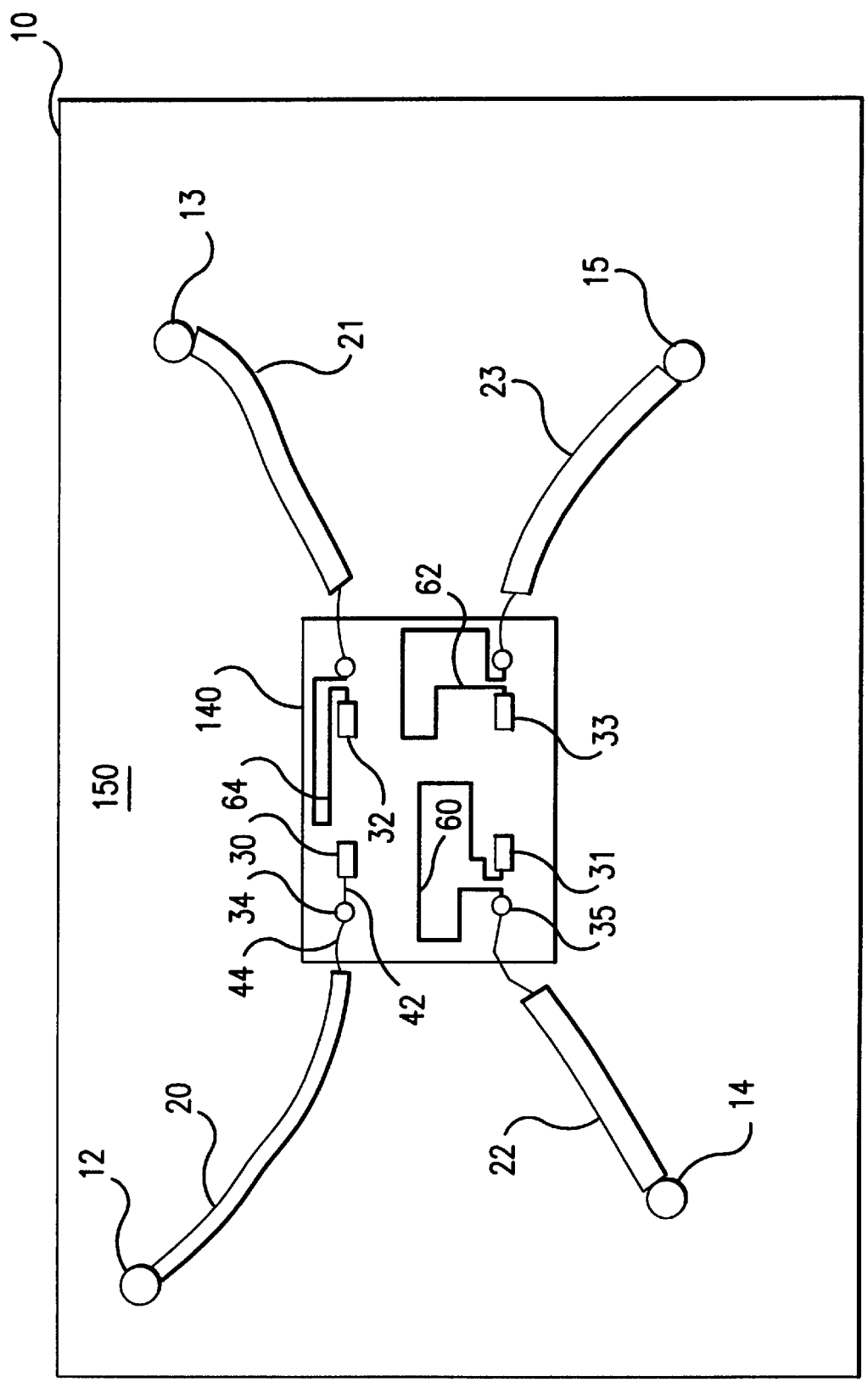
FIG. 2 is a plan view illustrating a semiconductor device in accordance with one embodiment of the present invention.

FIG. 2 is a plan view illustrating a semiconductor device 150 in accordance with one embodiment of the present invention. Semiconductor device 150 includes a die 140. Positioned across the top of die 140 are extended metal traces 60, 62, 64 that couple some of the output drivers to die pads. Extended metal traces 60, 62, 64 can be positioned along any available area on top of die 140 including along the edges and in the middle of die 140.

Extended metal traces 60, 62, 64 are of varying lengths to compensate for the varying time delays imposed by their respective lead fingers. The lengths of extended metal traces 60, 62, 64 in one embodiment are greater than the shortest distance between their corresponding die pad and output driver.

In one embodiment, the total electrical length of extended metal trace 60 and lead finger 22 is equal to the total electrical length of extended metal trace 62 and lead finger 23, which is equal to the total electrical length of extended metal trace 64 and 21, etc. The electrical length of a metal trace is the time required for a signal to propagate along the metal trace. A typical metal trace has an electrical length per distance of approximately 130–300 ps/inch. Because the total electrical lengths of each of the combinations of extended metal traces and lead fingers are equal, the signal delay for the group of signals at each pin 12–15 can be matched to within 10 ps by tuning die 140 below output drivers 30–33.

In some embodiments of the present invention, one or more die pads are coupled to an output driver using a standard metal trace (i.e., without using an extended metal trace) when no extra delay is required out to the corresponding pin. This typically occurs with the pin that is coupled to the longest lead finger among a group of signals. For example, in FIG. 2 output driver 30 is coupled to die pad 34 via standard metal trace 42.

Extended metal traces 60, 62, 64 must be wide enough to be able to carry a sufficient signal current. In one embodiment, the current carried across extended metal traces 60, 62, 64 is approximately 20–30 milliamps. In this embodiment, extended metal traces 60, 62, 64 are approximately 10–20 microns wide.

Figure 1:
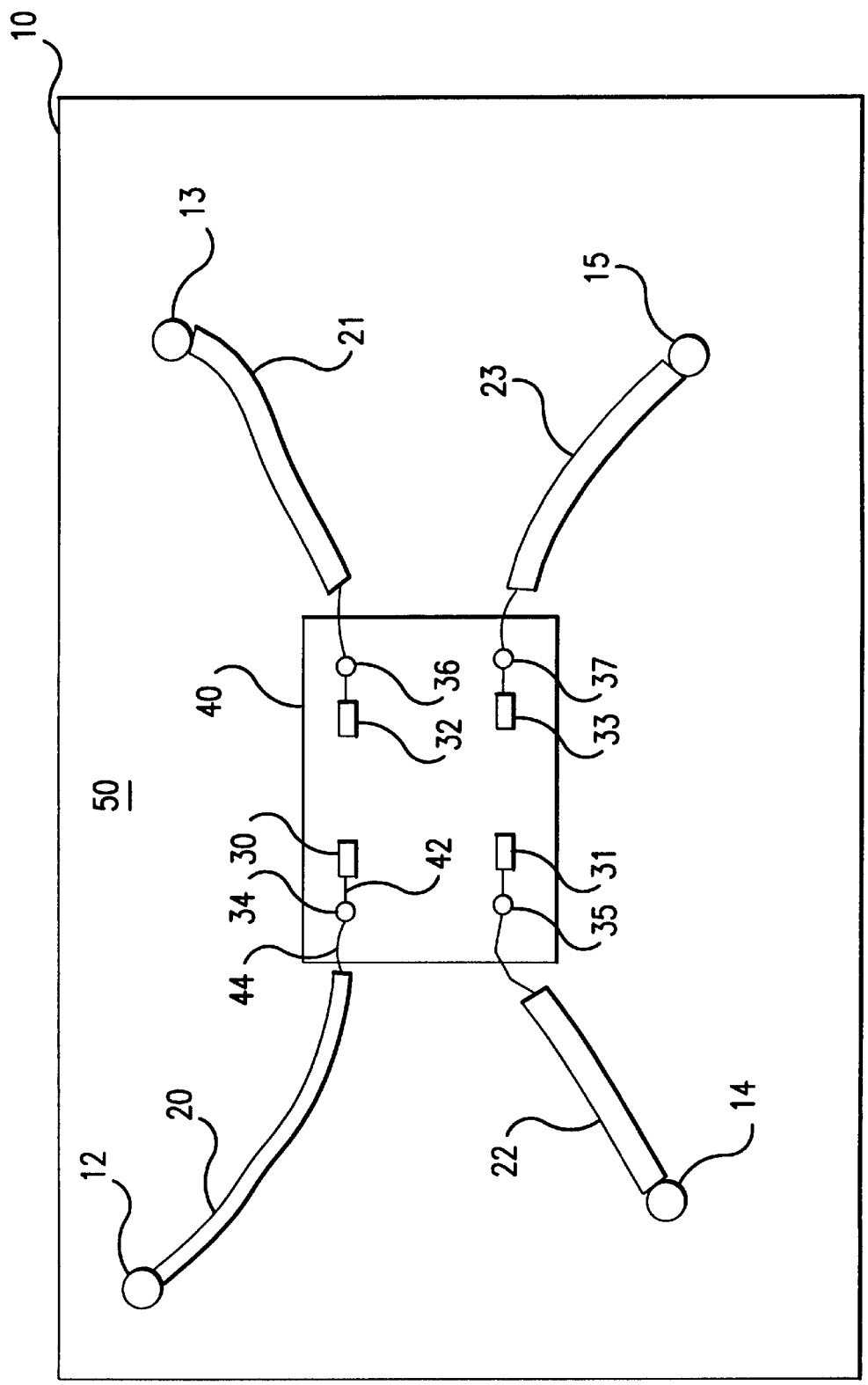
FIG. 1 is a plan view illustrating a simplified prior art semiconductor device.

The present invention allows a group of signals such as those signals output on pins 12–15 to be tuned so that they arrive at pins 12–15 within 10 ps of each other. In contrast, in the prior art of FIG. 1 die 40 could be tuned so that the signals arrived at pads 32–35 with approximately 10 ps of each other. However, this timing window was increased when die 40 is placed in package 10 due to timing skew from lead fingers 20–23. By enabling the group of signals to be tuned at pins 12–15, the present invention simplifies circuit board design.

Further, the present invention allows a die to more easily be used in different packages. With the present invention, the extended metal traces on top of the die can be modified to accommodate timing differences with each package. In contrast, with some prior art, paths within the die are required to be modified to account for the timing differences in the packages.

Several embodiments of the present invention are specifically illustrated and/or described herein. However, it will be appreciated that modifications and variations of the present invention are covered by the above teachings and within the purview of the appended claims without departing from the spirit and intended scope of the invention.

For example, in FIG. 2 all but one of the output drivers are coupled to a die pad by an extended metal trace. However, in a semiconductor device in accordance with the present invention, at least one output driver only must be coupled to a die pad by an extended metal trace.

What is claimed is:

1. A semiconductor device comprising:

a first and second pin;

a first lead finger coupled to said first pin and a second lead finger coupled to said second pin, wherein said first lead finger has a different electrical length than said second lead finger; and a die that comprises:

a first die pad coupled to said first lead finger and a second die pad coupled to said second lead finger; and a first output driver coupled to said first die pad and a second output driver coupled to said second die pad;

wherein said first output driver is coupled to said first die pad via a first metal trace and said second output driver is coupled to said second die pad via a second metal trace, wherein said first metal trace has a different electrical length than said second metal trace;

wherein a total electrical length of said first lead finger and said first metal trace is substantially equal to a total electrical length of said second lead finger and said second metal trace.

2. The semiconductor device of claim 1, wherein said first metal trace is positioned along a top of said die.

3. The semiconductor device of claim 1, wherein a width of said first metal trace is substantially 10–20 microns.

4. The semiconductor device of claim 1, wherein said first output driver and said first die pad are separated by a first distance, and a length of said first metal trace is greater than said first distance.

5. The semiconductor device of claim 3, wherein said second output driver and said second die pad are separated by a second distance, and a length of said second metal trace is approximately equal to said second distance.

6. A semiconductor die adapted to be coupled to a first lead and a second lead, wherein said first lead has a different electrical length than said second lead, said die comprising:

a first die pad adapted to be coupled to the first lead and a second die pad adapted to be coupled to the second lead;

a first metal trace coupled to said first die pad and a second metal trace coupled to said second die pad, wherein said first metal trace has a different electrical length than said second metal trace; and a first output driver coupled to said first metal trace and a second output driver coupled to said second metal trace;

wherein a combined electrical length of said first lead and said first metal trace is substantially equal to a combined electrical length of said second lead and said second metal trace.

7. The semiconductor die of claim 6, said die having a top side, wherein said first metal trace is positioned along said top side.

8. The semiconductor of claim 6, wherein said first metal trace has a first electrical length and said second metal trace has a second electrical length, wherein said first electrical length is greater than said second electrical length.

9. The semiconductor die of claim 6, wherein a width of said first metal trace is substantially 10–20 microns.

10. The semiconductor die of claim 6, wherein said first output driver and said first die pad are separated by a first distance, and a length of said first metal trace is greater than said first distance.

11. The semiconductor die of claim 6, wherein said second output driver and said second die pad are separated by a second distance, and a length of said second metal trace is substantially equal to said second distance.

12. The semiconductor device of claim 1, further comprising:

a third pin;

a third lead finger coupled to said third pin, wherein said third lead finger has a different electrical length than said first lead finger and said second lead finger;

said die further comprising:

a third die pad coupled to said third lead; and a third output driver coupled to said third die pad;

wherein said third output driver is coupled to said third die pad via a third metal trace;

wherein a total electrical length of said third lead finger and said third metal trace is substantially equal to a total electrical length of said first lead finger and said first metal trace.

* * * * *